(12) United States Patent
Lee

(10) Patent No.: US 10,256,115 B2
(45) Date of Patent: Apr. 9, 2019

(54) METHOD OF MANUFACTURING SEMICONDUCTOR DEVICE

(71) Applicant: SK hynix Inc., Icheon-si, Gyeonggi-do (KR)

(72) Inventor: Nam Jae Lee, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 264 days.

(21) Appl. No.: 15/286,804

(22) Filed: Oct. 6, 2016

(65) Prior Publication Data

US 2017/0352552 A1    Dec. 7, 2017

(30) Foreign Application Priority Data

Jun. 1, 2016  (KR) .......................... 10-2016-0068353

(51) Int. Cl.
| | |
|---|---|
| *H01L 21/48* | (2006.01) |
| *H01L 21/306* | (2006.01) |
| *H01L 21/3065* | (2006.01) |
| *H01L 21/308* | (2006.01) |
| *H01L 27/115* | (2017.01) |
| *H01L 21/822* | (2006.01) |
| *H01L 27/11582* | (2017.01) |

(52) U.S. Cl.
CPC ........ *H01L 21/486* (2013.01); *H01L 21/3065* (2013.01); *H01L 21/3085* (2013.01); *H01L 21/30604* (2013.01); *H01L 21/4846* (2013.01); *H01L 21/8221* (2013.01); *H01L 27/115* (2013.01); *H01L 27/11582* (2013.01)

(58) Field of Classification Search
CPC ................. H01L 21/486; H01L 27/115; H01L 21/30604; H01L 21/4846; H01L 21/8221; H01L 21/3065; H01L 27/11582; H01L 21/3085
See application file for complete search history.

(56) References Cited

U.S. PATENT DOCUMENTS

| | | | | |
|---|---|---|---|---|
| 9,099,527 | B2* | 8/2015 | Yoo ..................... | H01L 29/7926 |
| 9,214,409 | B2* | 12/2015 | Yoo ......................... | H01L 23/48 |
| 9,224,752 | B1* | 12/2015 | Lee .................. | H01L 27/11582 |
| 9,281,316 | B2* | 3/2016 | Lee .................. | H01L 29/66833 |
| 9,397,109 | B1* | 7/2016 | Fukuzumi ......... | H01L 27/11582 |
| 9,899,404 | B2* | 2/2018 | Yoo ......................... | H01L 23/48 |
| 2012/0273965 | A1* | 11/2012 | Seo .................. | H01L 27/11565 |
| | | | | 257/774 |

(Continued)

FOREIGN PATENT DOCUMENTS

| | | |
|---|---|---|
| KR | 1020130133566 A | 12/2013 |
| KR | 1020140112827 A | 9/2014 |

*Primary Examiner* — Savitr Mulpuri
(74) *Attorney, Agent, or Firm* — William Park & Associates Ltd.

(57) ABSTRACT

A method of manufacturing a semiconductor device may include forming a first stack structure by alternately stacking first material layers and second material layers, forming first holes penetrating the first stack structure and a first slit located between the first holes, forming channel patterns in the first holes and a dummy channel pattern in the first slit, selectively removing the dummy channel pattern from the first slit, and replacing the first material layers with third material layers through the first slit.

20 Claims, 10 Drawing Sheets

(56) References Cited

U.S. PATENT DOCUMENTS

| | | | |
|---|---|---|---|
| 2013/0069140 A1* | 3/2013 | Ichinose | H01L 29/7926 257/324 |
| 2013/0095654 A1* | 4/2013 | Kwon | H01L 21/76805 438/666 |
| 2013/0234234 A1* | 9/2013 | Yoo | H01L 29/66833 257/324 |
| 2013/0320486 A1* | 12/2013 | Yoo | H01L 23/48 257/508 |
| 2014/0162420 A1* | 6/2014 | Oh | H01L 27/11565 438/270 |
| 2014/0239376 A1* | 8/2014 | Zhang | H01L 29/7827 257/324 |
| 2015/0287739 A1* | 10/2015 | Lee | H01L 27/11575 257/326 |
| 2016/0064407 A1* | 3/2016 | Kim | H01L 27/11556 257/324 |
| 2016/0071855 A1* | 3/2016 | Park | H01L 27/11556 257/314 |
| 2016/0079272 A1* | 3/2016 | Lee | H01L 27/11582 438/269 |
| 2016/0260716 A1* | 9/2016 | Lee | H01L 29/0649 |
| 2017/0025432 A1* | 1/2017 | Yune | H01L 27/11582 |
| 2017/0062464 A1* | 3/2017 | Aoyama | H01L 27/11582 |
| 2017/0110473 A1* | 4/2017 | Lee | H01L 21/76897 |
| 2017/0213846 A1* | 7/2017 | Lee | H01L 27/11582 |
| 2017/0358356 A1* | 12/2017 | Lee | H01L 29/16 |
| 2018/0130817 A1* | 5/2018 | Kim | H01L 27/11582 |

* cited by examiner

METHOD OF MANUFACTURING SEMICONDUCTOR DEVICE

CROSS-REFERENCE TO RELATED APPLICATION

The present application claims priority under 35 U.S.C. § 119(a) to Korean patent application number 10-2016-0068353 filed on Jun. 1, 2016 in the Korean Intellectual Property Office, the entire disclosure of which is incorporated herein by reference.

BACKGROUND

1. Technical Field

An aspect of the present disclosure generally relates to a method of manufacturing an electronic device, and more particularly to a method of manufacturing a three-dimensional semiconductor device.

2. Related Art

Nonvolatile memory devices are memory devices that retain their data even when a power supply is cut off. As a two-dimensional nonvolatile memory technology is reaching its physical scaling limit, some semiconductor manufacturers are producing three-dimensional nonvolatile memory devices in which memory cells are vertically stacked on top of each other on a substrate.

The three-dimensional nonvolatile memory device may include interlayer insulating layers and gate electrodes, which are alternately stacked, and channel layers penetrating the interlayer insulating layers and the gate electrodes. The memory cells are arranged along the channel layers. Various structures and manufacturing methods have been developed to improve the reliability of the three-dimensional nonvolatile memory devices and to improve manufacturing yield.

SUMMARY

According to an aspect of the present disclosure, there is provided a method of manufacturing a semiconductor device. The method may include forming a first stack structure by alternately stacking first material layers and second material layers. The method may include forming first holes penetrating the first stack structure and a first slit located between the first holes. The method may include forming channel patterns in the first holes and a dummy channel pattern in the first slit. The method may also include selectively removing the dummy channel pattern from the first slit, and replacing the first material layers with third material layers through the first slit.

According to an aspect of the present disclosure, there is provided a method of manufacturing a semiconductor device. The method may include forming a first stack structure by alternately stacking first sacrificial layers and the first insulating layers. The method may include forming first holes penetrating the first stack structure and a first slit located between the first holes. The method may include forming, on the first stack structure, a second stack structure by alternately stacking second sacrificial layers and second insulating layers. The method may include forming second holes and a second slit. The second holes may penetrate the second stack structure, and may be connected to the first holes. The second slit may penetrate the second stack structure, and may be connected to the first slit. The method may include forming channel patterns in the first and second holes and a dummy channel pattern in the first and second slits. The method may also include selectively removing the dummy channel pattern and replacing the sacrificial layers with conductive layers through the first and second slits.

BRIEF DESCRIPTION OF THE DRAWINGS

FIGS. 1A to 8A and 1B to 8B are diagrams illustrating an example method of manufacturing a semiconductor device according to an embodiment of the present disclosure.

DETAILED DESCRIPTION

Figure 1A:
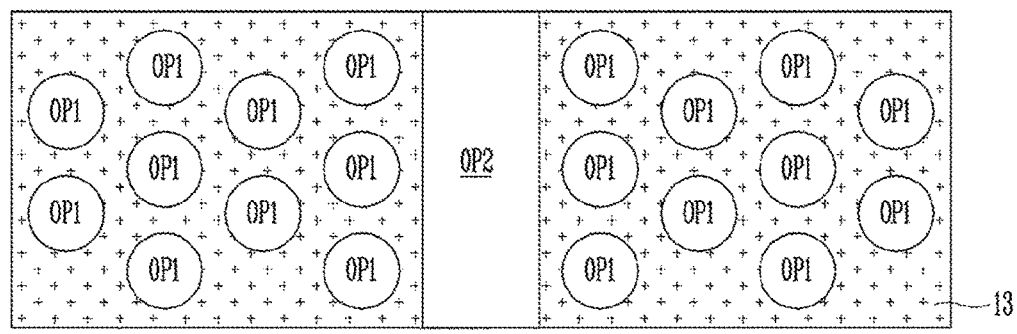

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Example embodiments of the present disclosure will be described with reference to the accompanying drawings. The example embodiments of the present disclosure may, however, be embodied in many different forms and should not be construed as limited to the example embodiments set forth herein. Rather, the example embodiments are provided so that disclosure of the present disclosure will be thorough and complete, and will fully convey the scope of the present disclosure to those skilled in the art. The features of example embodiments of the present disclosure may be employed in various and numerous embodiments without departing from the scope of the present disclosure. In the drawings, the size and relative sizes of layers and areas may be exaggerated for clarity. The drawings are not to scale. Like reference numerals refer to like elements throughout.

FIGS. 1A to 8A and 1B to 8B are diagrams illustrating a method of manufacturing a semiconductor device according to an embodiment of the present disclosure. FIGS. 1A to 8A are layouts, and FIGS. 1B to 8B are cross-sectional views.

Figure 1B:
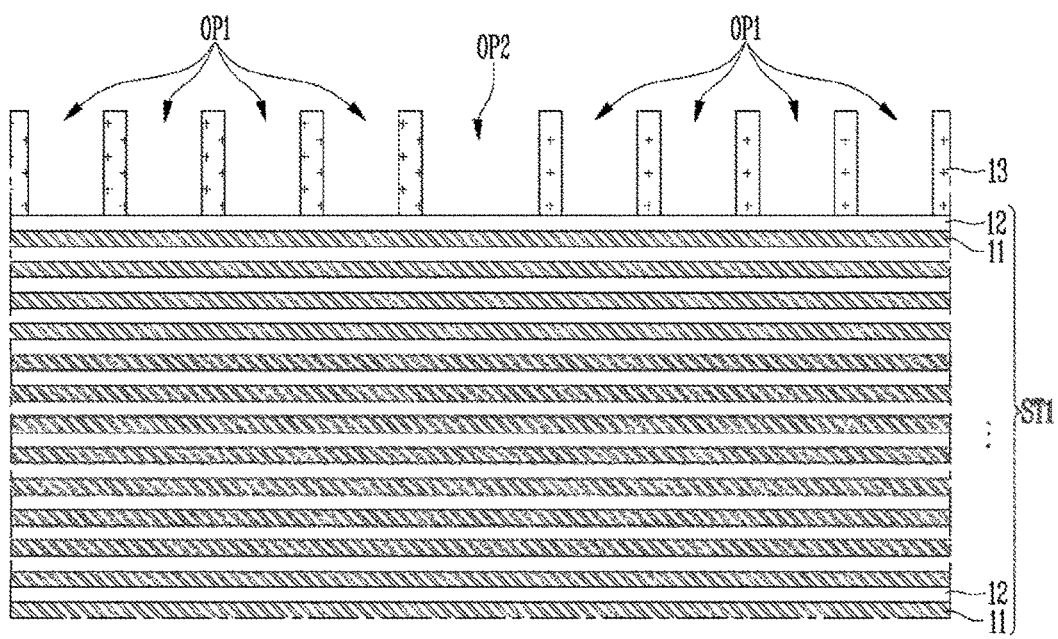

Referring to FIGS. 1A and 1B, a first stack structure ST1 may be formed. The first stack structure ST1 may include first material layers 11 and second material layers 12, which are alternately stacked. For example, the first stack structure ST1 may be formed on a substrate (not illustrated) on which a lower structure including, for example, a source structure and a pipe structure are formed. The substrate may include a cell region in which a memory array (e.g., memory cell strings) is located and a peripheral region in which peripheral circuitry for driving the memory cell string is located. The first stack structure ST1 may be located in the cell region. After a series of subsequent process steps, the first stack structure ST1 may become a lower portion of stacked memory cell structure.

The first material layers 11 may be used to form conductive layers such as word lines, select lines, pads, and the like. The second material layers 12 may be used to insulate the stacked conductive layers from each other. Among the first material layers 11, at least one uppermost first material layer 11 may become an upper select line, at least one lowermost first material layer 11 may become a lower select line, and the other first material layers 11 may become word lines. In this case, a plurality of memory cells included in the memory cell string may be vertically arranged on the substrate. Alternatively, among the first material layers 11, at least one uppermost first material layer 11 may become a select line, at least one lowermost first material layer 11 may become a pipe gate, and the other first material layers 11 may become word lines. In this case, the memory cell string may be formed in a U-shape or W-shape.

The first material layers 11 may be formed of a material having a higher etching selectivity compared to the second material layers 12. In an example, the first material layers 11 may include a sacrificial material such as nitride, and the second material layers 12 may include an insulating material such as oxide. In an example, the first material layers 11 may include a conductive material such as polysilicon or tungsten, and the second material layers 12 may include an insulating material such as oxide. In an example, the first material layers 11 may include a conductive material such as doped polysilicon, and the second material layers 12 may include a sacrificial material such as undoped polysilicon.

Subsequently, a first mask pattern 13 may be formed on the first stack structure ST1. The first mask pattern 13 may include a plurality of openings OP1 and OP2, and the openings OP1 and OP2 may be distributed at a uniform distance from one another. For example, the first openings OP1 may be holes having a section formed in a circular shape, an elliptical shape, a quadrangular shape, a polygonal shape, or the like, and the second opening OP2 may be a slit having a section formed in a line shape extending in one direction. Also, the second opening OP2 may be located between the first openings OP1. Since the first mask pattern 13 is used as a barrier for patterning a structure having a high aspect ratio, the first mask pattern 13 may be formed of sufficient thickness by considering a potential loss of constituent materials thereof caused by a subsequent etching process.

Figure 2A:
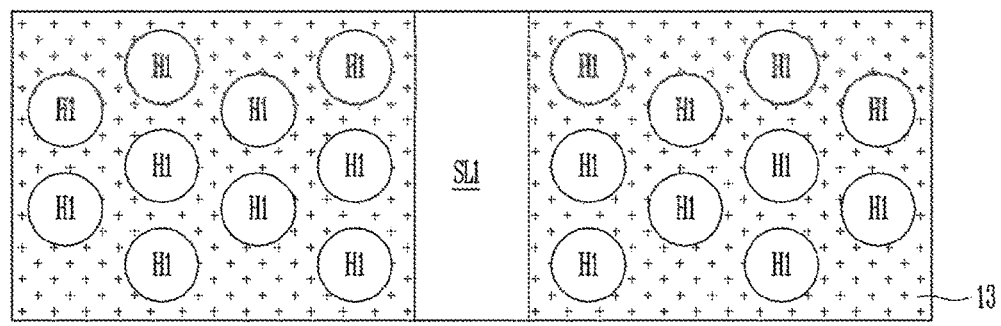
Figure 2B:
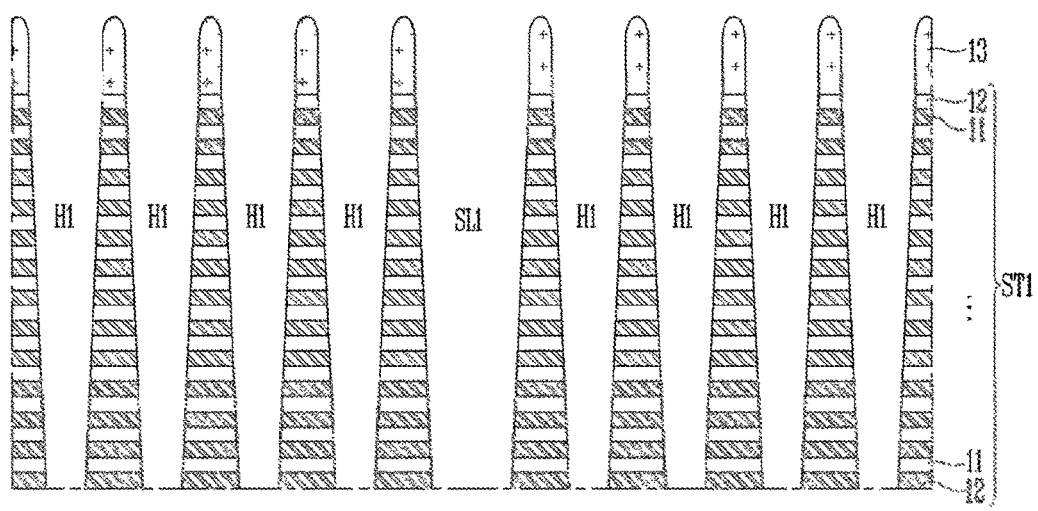

Referring to FIGS. 2A and 2B, the first stack structure ST1 may be etched using the first mask pattern 13 as an etch barrier, thereby forming first holes H1 and a first slit SL1. Here, the first holes H1 and the first slit SL1 may be simultaneously formed to have substantially the same depth. For example, the first holes H1 and the first slit SL1 may be formed of a depth that exposes the first material layers. Here, the term "substantially the same" means not only that numerical values correspond to each other but also that the numerical values are within a range including errors in the processes. For example, the term "substantially the same depth" means not only that the first holes H1 and the first slit SL1 are formed of the same depth as each other, but also that there may be some discrepancies between the depth of the first holes H1 and the depth of the first slit SL1 that occur as a result of errors in the process.

If the first holes H1 and the first slit SL1 are formed through separate etching process steps, it may be difficult to obtain a desired pattern uniformity in the etching process. It is not desirable that first holes H1 are concentrated on a certain region. In this case, a profile of the first holes H1 may change depending on a pattern density. When the first holes H1 are formed into a structure having a high aspect ratio, a difference between upper and lower widths of each of the first holes H1 is increased, and an etching depth of the first holes H1 becomes non-uniform. Therefore, the upper width of each of the first holes H1 may be formed to be wider by considering that the width of each first hole H1 tapers from an upper portion to a lower portion of the first hole H1. On the other hand, according to an embodiment of the present disclosure, the first holes H1 and the first slit SL1, which are uniformly distributed, are simultaneously formed, and thus the first holes H1 and the first slit SL1 can be formed to have a uniform profile. Accordingly, it is possible to decrease widths of the first holes H1 and the first slit SL1.

In the etching process for the first holes H1 and the first slit SL1, a partial thickness of the mask pattern 13 may be lost. Here, an amount of loss of constituent materials of the first mask pattern 13 may vary depending on a density of the pattern. In this case, the loss amount becomes larger as the density of the pattern becomes higher, and the loss amount becomes smaller as the density of the pattern becomes lower. If the first holes H1 and the first slit SL1 are formed through separate etching process steps, the first mask pattern 13 may be non-uniformly lost depending on a density of the pattern. In addition, if the thickness of the first mask pattern 13 becomes non-uniform, the profile of the first holes H1 is influenced by the non-uniform thickness. However, according to an embodiment of the present disclosure, the first holes H1 and the first slit SL1, which are uniformly distributed, are simultaneously formed, and thus the loss amount of the mask pattern 13 may be uniform. Accordingly, it is possible to obtain a desired etching profile. For reference, when the first slit SL1 has a wider width than the first hole H1, the loss amount from a peripheral region of the first slit SL1 in the first mask pattern 13 may be smaller than the loss amount from the first hole H1.

Figure 3A:
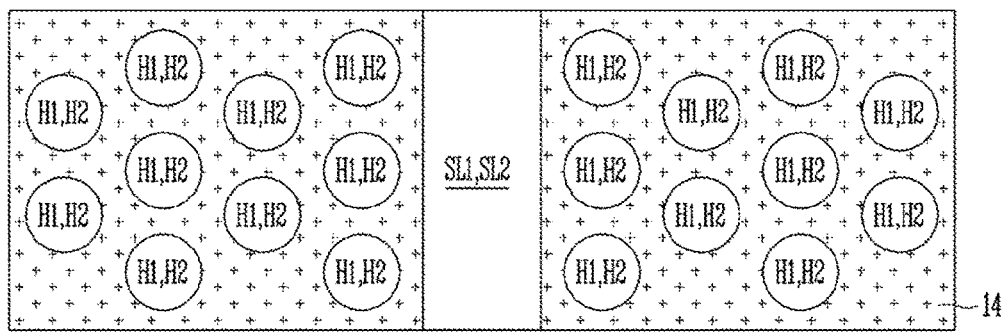
Figure 3B:
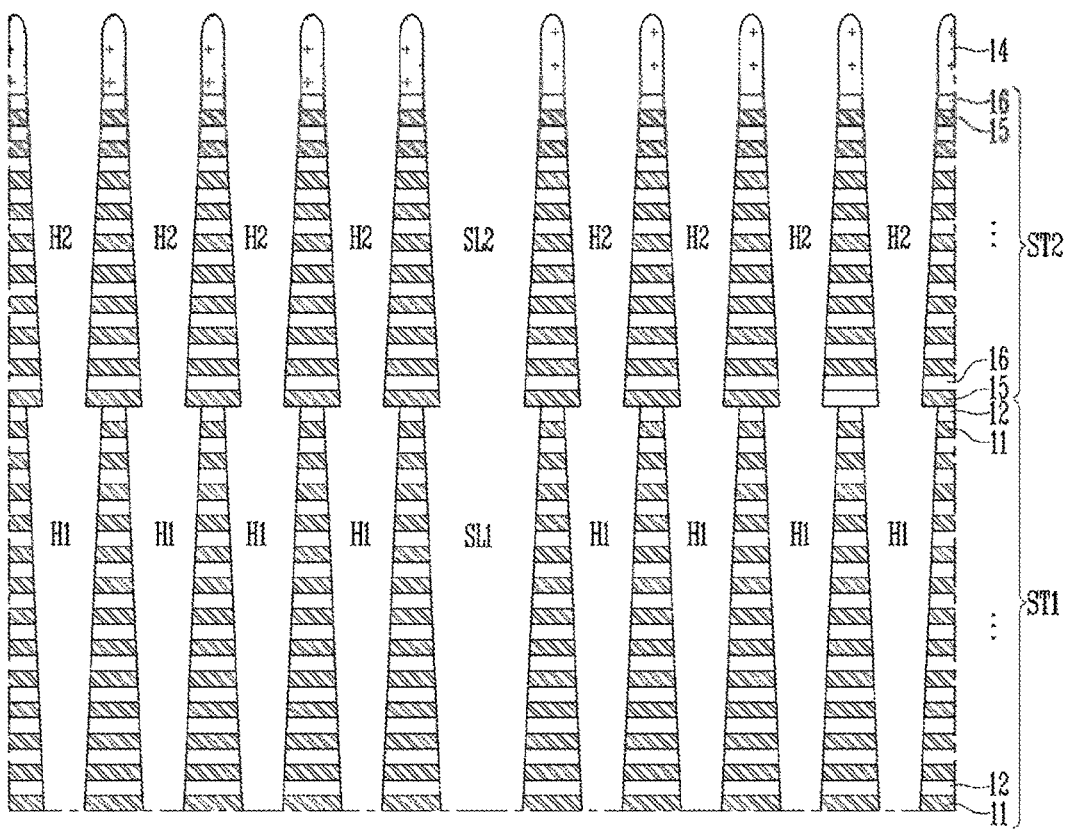

Referring to FIGS. 3A and 3B, after the first mask pattern 13 is removed, a second stack structure ST2 including third material layers 15 and fourth material layers 16, which are alternately stacked, may be formed on the first stack structure ST1. For example, after a sacrificial pattern is formed in the first holes H1 and the first slit SL1, the second stack structure ST2 may be formed. The third material layers 15 may be formed of the same material as the first material layers 11, and the fourth material layers 16 may be formed of the same material as the second material layers 12.

Subsequently, second holes H2 and a second slit SL2, which penetrate the second stack structure ST2, may be formed. Here, the second holes H2 and the second slit SL2 may be formed using a method similar to that of the first holes H1 and the first slit SL1, described above. For example, a second mask pattern 14 may be formed on the second stack structure ST2, and then the second stack structure ST2 may be etched using the second mask pattern 14 as an etch barrier, thereby forming the second holes H2 and the second slit SL2. The second holes H2 may be connected to the first holes H1, respectively, and the second slit SL2 may be connected to the first slit SL1.

Subsequently, when the sacrificial pattern is formed in the first holes H1 and the first slit SL1, the first holes H1 and the first slit SL1 may be exposed by removing the sacrificial pattern through the second holes H2 and the second slit SL2.

Figure 4A:
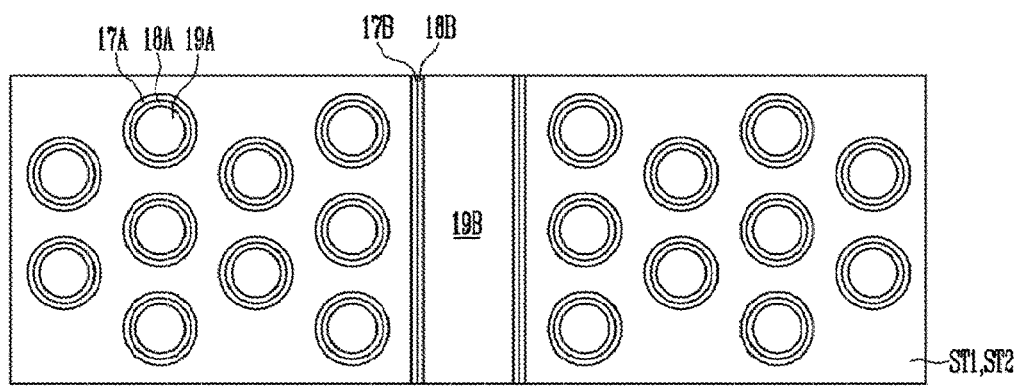
Figure 4B:
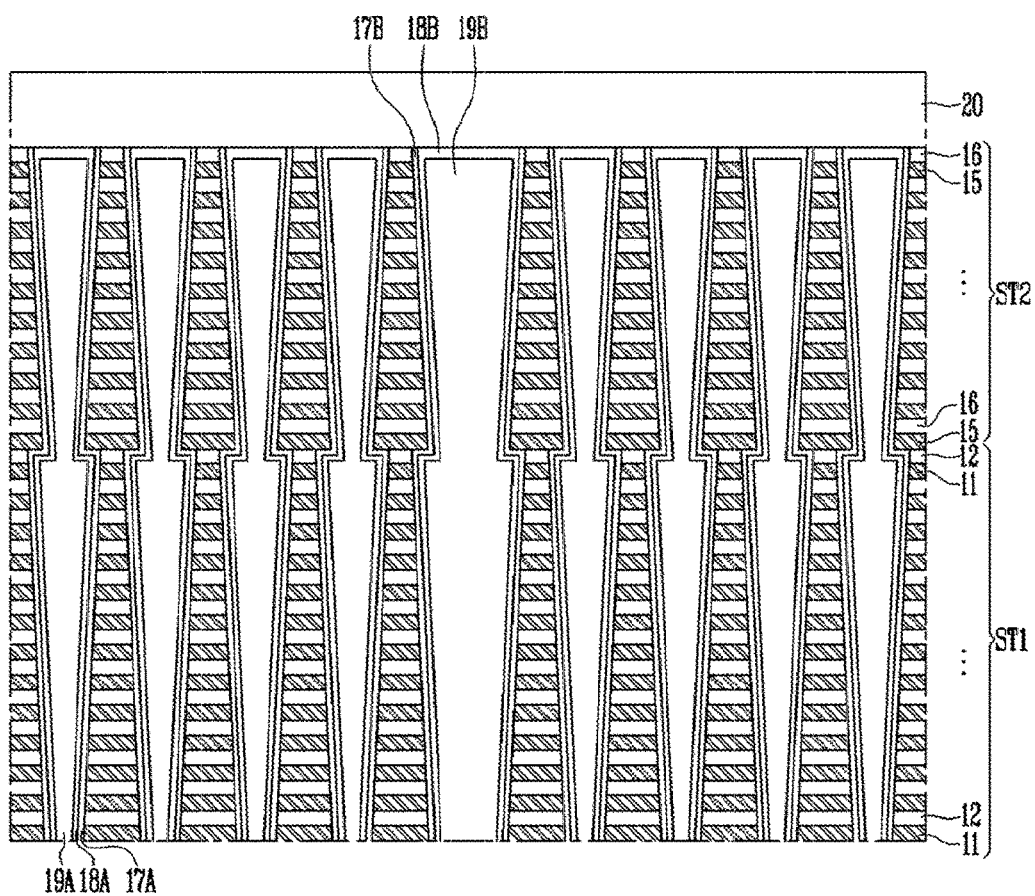

Referring to FIGS. 4A and 4B, channel patterns 18A may be formed in the first and second holes H1 and H2. One channel pattern 18A may be formed in the first and second holes H1 and H2 vertically connected to each other. Before the channel patterns 18A are formed, memory patterns 17A may be formed in the first and second holes H1 and H2. For example, the memory patterns 17A may include at least one of a charge blocking layer, a data storage layer, and a tunnel insulating layer, and the data storage layer may include a floating gate such as silicon, a charge trap material such as nitride, a phase change material, nano dots, and the like. Each of the channel patterns 18A may be formed in a shape that fills central regions of the first and second holes H1 and H2. Alternatively, each of the channel patterns 18A may be formed in a structure in which at least a portion of the central region of the first and second holes H1 and H2 remains empty. Here, a gap fill layer 19A may be formed in the empty central region of the channel pattern 18A.

In addition, a dummy channel pattern 18B may be formed in the first and second slits SL1 and SL2. For example, one dummy channel pattern 18B is formed in the vertically connected first and second slits SL1 and SL2. Before the dummy channel pattern 18B is formed, a dummy memory pattern 17B may be formed in the first and second slits SL1 and SL2. Each of the dummy channel patterns 18B may be formed in a shape that fills central regions of the first and second slits SL1 and SL2. Alternatively, each of the dummy channel patterns 18B may be formed into a structure in which at least a portion of the central region of the first and second holes H1 and H2 remains empty. Here, a dummy gap fill layer 19B may be formed in the empty central region.

Here, the channel pattern 18A and the dummy channel pattern 18B may be formed of the same material, and the dummy channel pattern 18B may be formed together with the channel pattern 18A when the channel pattern 18A is formed. Similarly, the memory pattern 17A and the dummy memory pattern 17B may be formed of the same material, and the dummy memory pattern 17B may be formed together with the memory pattern 17A when the memory pattern 17A is formed. Also, the gap fill layer 19A and the dummy gap fill layer 19B may be formed of the same material, and the dummy gap fill layer 19B may be formed together with the gap fill layer 19A when the gap fill layer 19A is formed. As described above, the channel pattern 18A and the dummy channel pattern 18B may be formed in the first hole H1, the second hole H2, the first slit SL1, and the second slit SL2, which are uniformly distributed. Thus, the channel pattern 18A and the dummy channel pattern 18B, may be formed to have a uniform profile.

Subsequently, an interlayer insulating layer 20 may be formed on the second stack structure ST2. The interlayer insulating layer 20 may include an insulating material such as oxide.

Figure 5A:
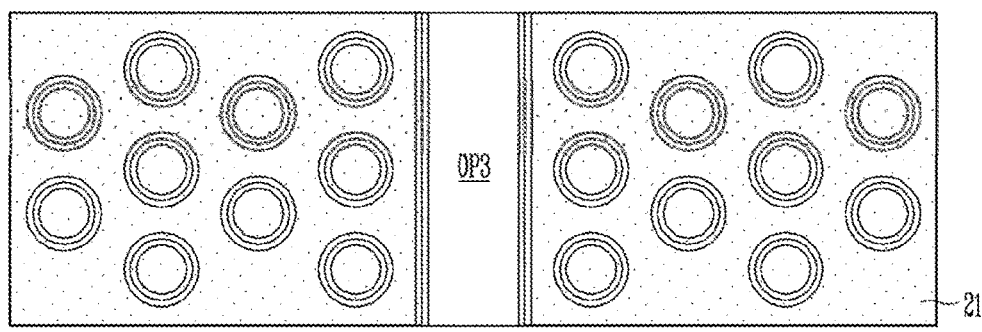
Figure 5B:
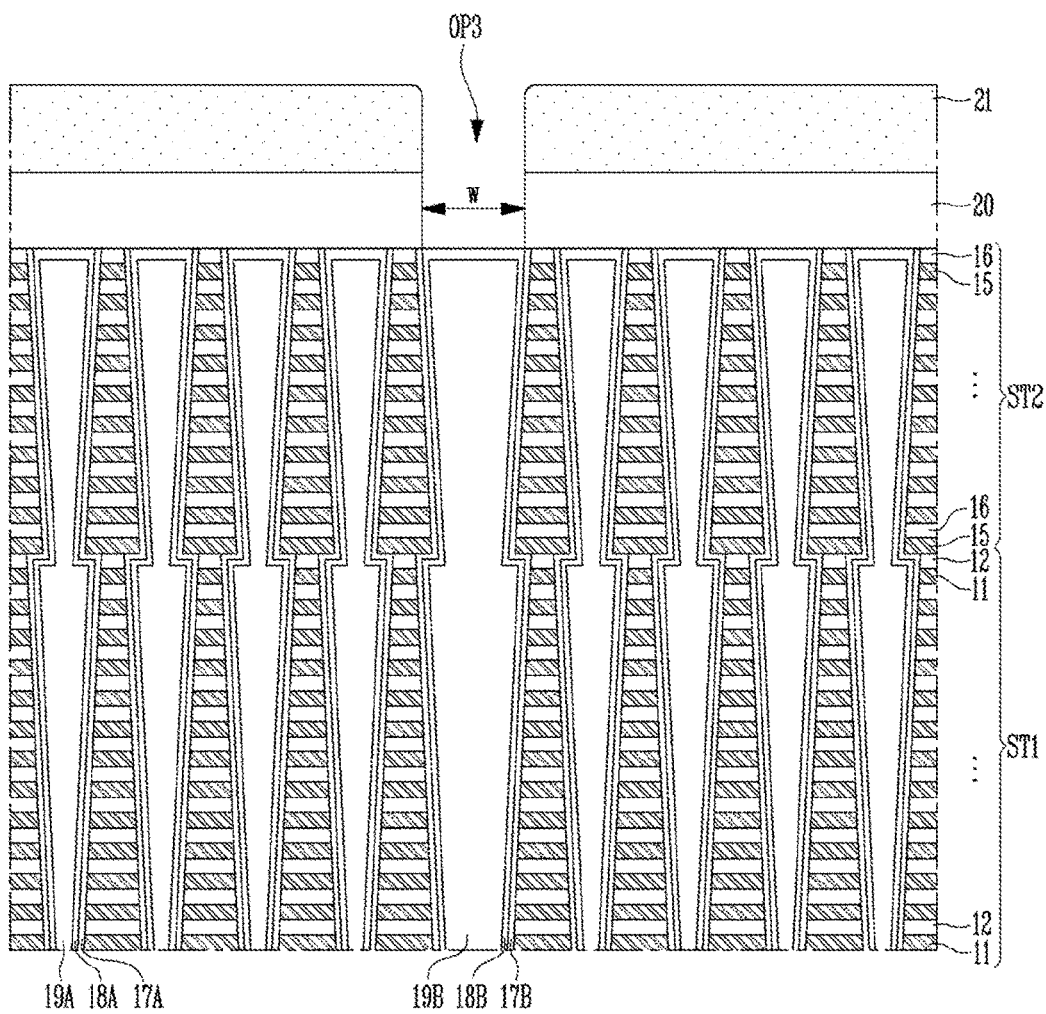
Figure 6A:
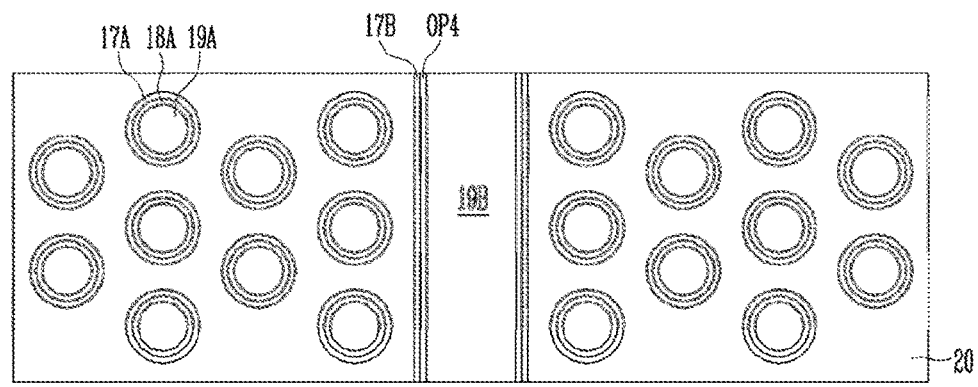
Figure 6B:
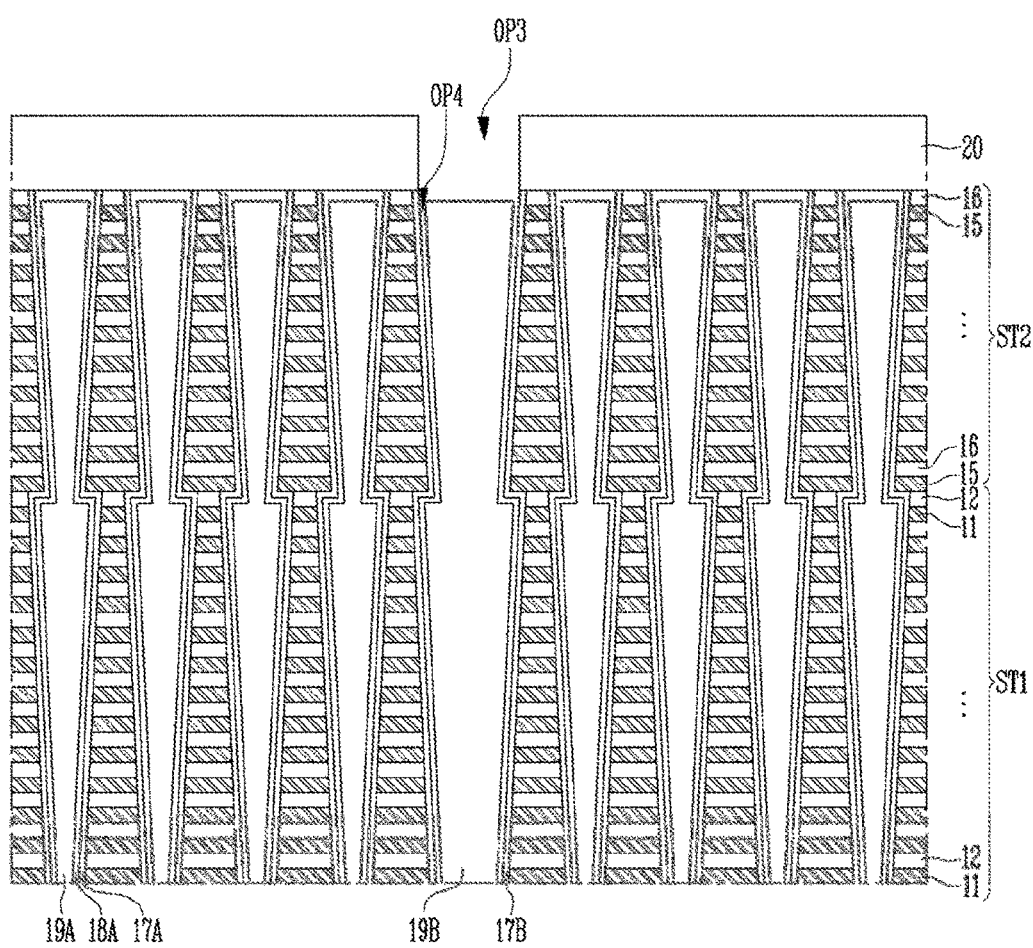
Figure 7A:
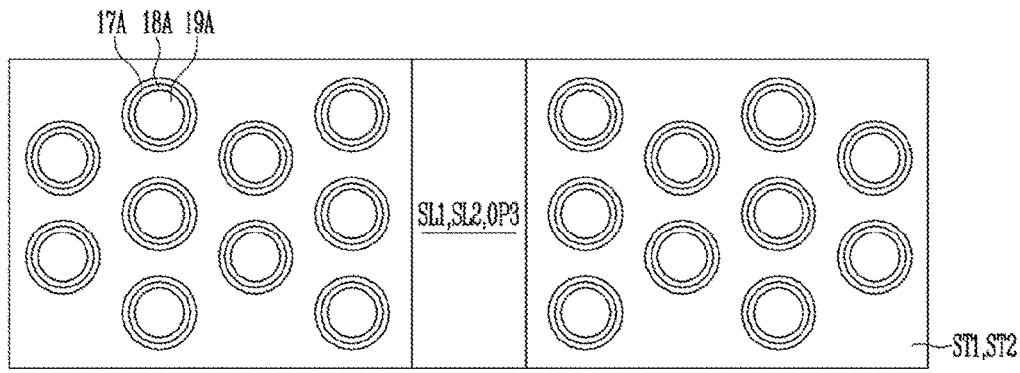
Figure 7B:
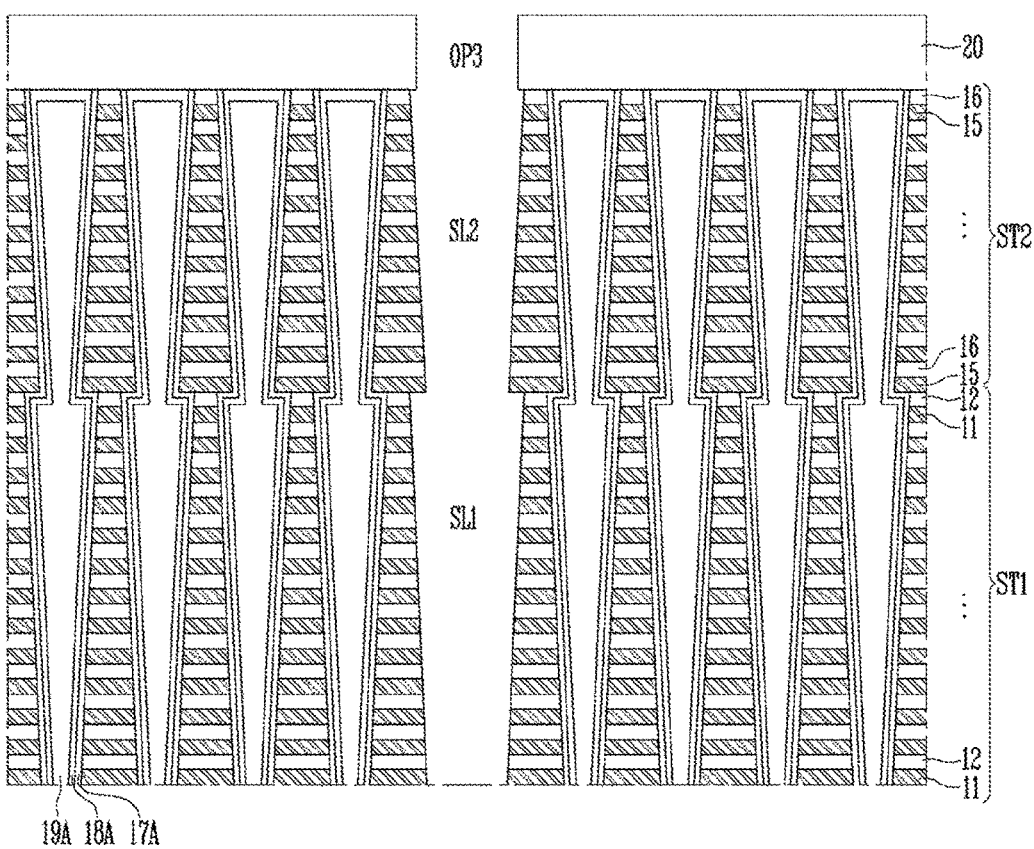

Referring to FIGS. 5A and 5B, a third opening OP3 penetrating the interlayer insulating layer 20 and exposing the dummy channel pattern 18B therethrough may be formed. For example, a third mask pattern 21 may be formed on the interlayer insulating layer 20, and then the interlayer insulating layer 20 may be etched using the third mask pattern 21 as an etch barrier, thereby forming the third opening OP3. Here, the third mask pattern 21 may include an opening that exposes at least the dummy channel pattern 18B, and may be formed to cover the memory pattern 17A, the channel pattern 18A, and the gap fill layer 19A in the first and second holes H1 and H2. Accordingly, the dummy channel pattern 18B in the second slit SL2 may be selectively exposed.

The range of exposed layers may be controlled depending on a width W of the third opening OP3. For example, the third opening OP3 may have a width W at which the dummy gap fill layer 19B and the dummy channel pattern 18B are exposed, or may have a width at which the dummy gap fill layer 19B, the dummy channel pattern 18B, and the dummy memory pattern 17B are exposed. When the dummy gap fill layer 19B includes a channel region in which the dummy channel pattern 18B surrounds a sidewall of the dummy gap fill layer 19B and a contact region in which the dummy channel pattern 18B surrounds an upper surface of the dummy gap fill layer 19B, the contact region of the dummy gap fill layer 19B may be exposed through the third opening OP3, and the dummy gap fill layer 19B may not be directly exposed.

Referring to FIGS. 6A to 7B, the dummy memory pattern 17B, the dummy channel pattern 18B, and the dummy gap fill layer 19B are selectively removed through the third opening OP3, thereby exposing the first and second slits SL1 and SL2. At this time, the memory pattern 17A, the channel pattern 18A, and the gap fill layer 19A in the first and second holes H1 and H2 may remain because they are protected by the interlayer insulating layer 20.

For example, after the dummy channel pattern 18B is selectively removed, the dummy memory pattern 17B and the dummy gap fill layer 19B may be removed. First, referring to FIGS. 6A and 6B, the dummy channel pattern 18B may be selectively removed through the third opening OP3, thereby forming a fourth opening OP4. Subsequently, referring to FIGS. 7A and 7B, the dummy memory pattern 17B and the dummy gap fill layer 19B, which are exposed through the third opening OP3 and the fourth opening OP4, may be selectively removed. Thus, although the dummy memory pattern 17B is not exposed through the third opening OP3 as the third opening OP3 has a narrower width than the second slit SL2, the dummy memory pattern 17B can be removed through the fourth opening OP4.

Here, the dummy channel pattern 18B, the dummy memory pattern 17B, and the dummy gap fill layer 19B may be etched using a wet etching process or dry etching process. For example, when the dummy channel pattern 18B may include a semiconductor material such as polysilicon, and the dummy memory pattern 17B and the dummy gap fill layer 19B may include a dielectric material such as oxide or nitride, the dummy channel pattern 18B may be etched using the wet etching process, and then the dummy memory pattern 17B and the dummy gap fill layer 19B may be removed using the wet etching process or dry etching process. When the dummy memory pattern 17B has a multi-layered structure of a charge blocking layer, a data storage layer, and a tunnel insulating layer, the dummy memory pattern 17B may be removed by combining the wet etching process and dry etching process.

Figure 8A:
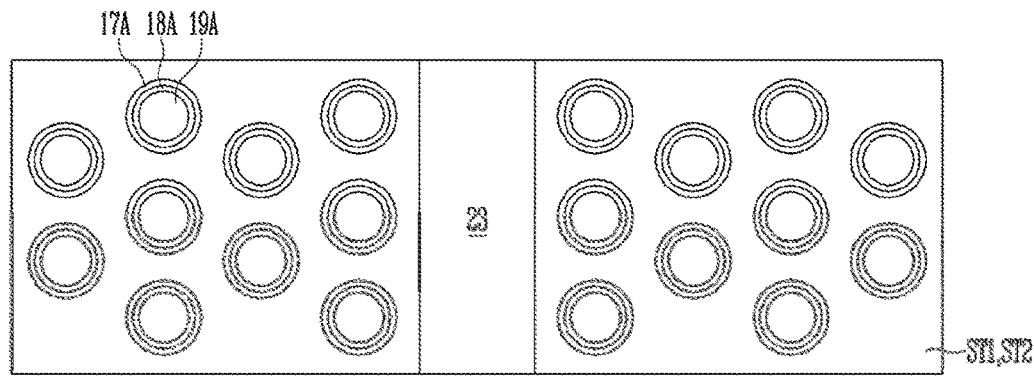
Figure 8B:
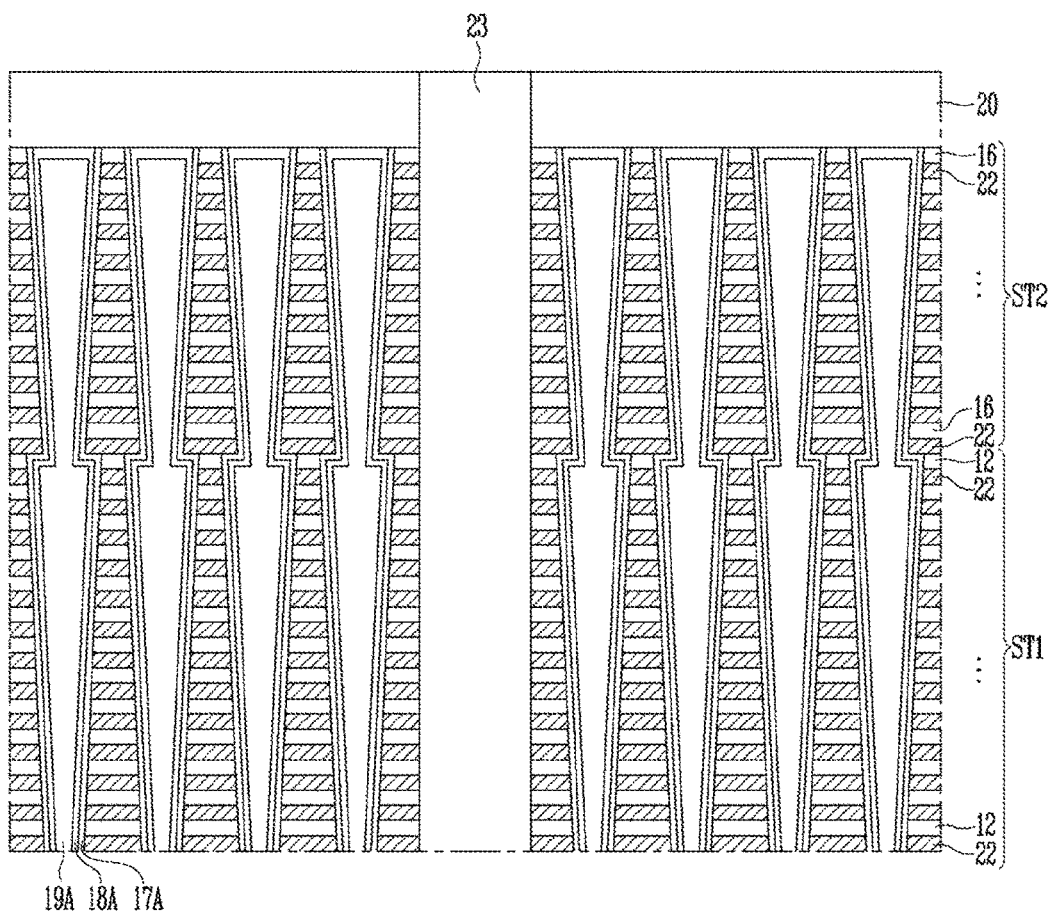

Referring to FIGS. 8A and 8B, an additional machining process may be performed such that the first and second slits SL1 and SL2 have a uniform width. For example, when each of the first and second slits SL1 and SL2 tapers from its upper portion to its lower portion, a bump may be formed at an interface between the first and second slits SL1 and SL2. Thus, the bump may be etched using an etch process such as an etch-back process and a blanket etch process so that the first and second slits can have a uniform width.

Subsequently, the first and third material layers 11 and 15 may be replaced with fifth material layers 22 through the first slit SL1, the second slit SL2, and the third opening OP3, or the second and fourth material layers 12 and 16 may be replaced with the fifth material layers 22 through the first slit SL1, the second slit SL2, and the third opening OP3. For example, openings are formed by removing the first and third material layers 11 and 15, and the fifth material layers 22 are then formed in the openings.

In an example, if the first and third material layers 11 and 15 are sacrificial layers and the second and fourth material layers 12 and 16 are insulating layers, the first and third material layers 11 and 15 may be replaced with conductive layers. In an example, if the first and third material layers 11 and 15 are conductive layers and the second and fourth material layers 12 and 16 are insulating layers, the first and third material layers 11 and 15 may be silicidized, thereby forming metal silicide layers. In this case, only some portions of the first and third material layers 11 and 15 may be silicidized. In an example, if the first and third material layers 11 and 15 are conductive layers and the second and fourth material layers 12 and 16 are sacrificial layers, the second and fourth material layers 12 and 16 may be replaced with insulating layers.

Subsequently, a slit insulating layer 23 may be formed in the first slit SL1, the second slit SL2, and the third opening OP3.

Figure 9:
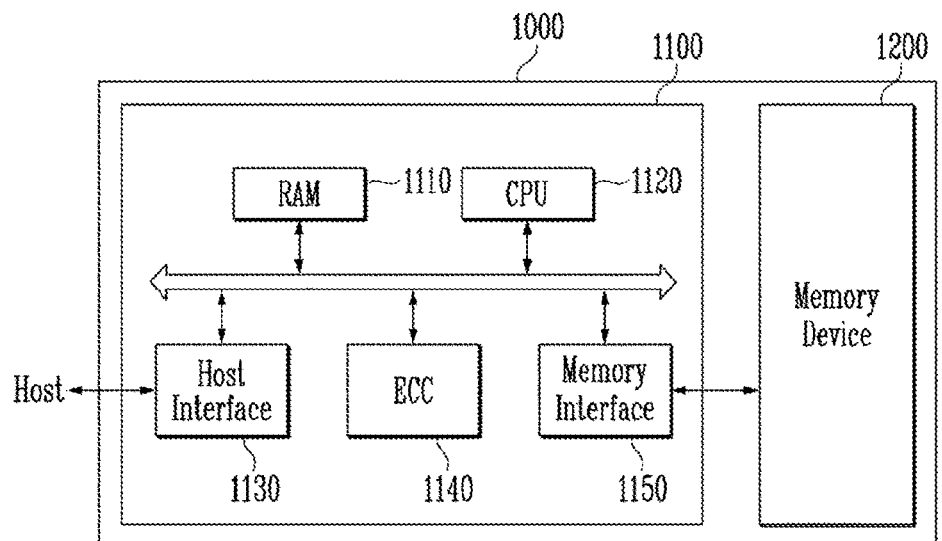
FIG. 9 is a diagram illustrating an example configuration of a memory system according to an embodiment of the present disclosure.

FIG. 9 is a diagram illustrating an example configuration of a memory system according to an embodiment of the present disclosure.

Referring to FIG. 9, the memory system 1000 according to an embodiment of the present disclosure may include a memory device 1200 and a controller 1100.

The memory device 1200 may be used to store data information having various data formats such as texts, graphics, and software codes. The memory device 1200 may be a nonvolatile memory, and may be manufactured according to the manufacturing method described with reference to FIGS. 1A to 8B. The structure and manufacturing method of the memory device 1200 are the same as those described above, and therefore their detailed descriptions will be omitted.

The controller 1100 may be coupled to a host and the memory device 1200, and may access the memory device 1200 in response to a request from the host. For example, the controller 1100 may control reading, writing, erasing, and background operations of the memory device 1200.

The controller 1100 may include a random access memory (RAM) 1110, a central processing unit (CPU) 1120, a host interface 1130, an error correction code (ECC) circuit 1140, a memory interface 1150, and the like.

Here, the RAM 1110 may be used as an operation memory of the CPU 1120, a cache memory between the memory device 1200 and the host, and a buffer memory between the memory device 1200 and the host. Examples of the RAM 1110 may include a static random access memory (SRAM), and may be replaced with a read only memory (ROM).

The CPU 1120 may control the general operations of the controller 1100. For example, the CPU 1120 may operate firmware such as a flash translation layer (FTL) stored in the RAM 1110.

The host interface 1130 may interface with the host. For example, the controller 1100 may communicate with the host using at least one of a variety of interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, an integrated drive electronics (IDE) protocol, and a private protocol.

The ECC circuit 1140 may detect and correct an error included in data read from the memory device 1200, using an error correction code (ECC).

The memory interface 1150 may interface with the memory device 1200. For example, the memory interface 1150 may include an NAND interface or NOR interface.

The controller 1100 may further include a buffer memory (not illustrated) for temporarily storing data. Here, the buffer memory may be used to temporarily store data transferred to an external device through the host interface 1130 or may be used to temporarily store data transferred from the memory device 1200 through the memory interface 1150. The controller 1100 may further include a ROM that stores code data for interfacing with the host.

As described above, the memory system 1000 according to an embodiment of the present disclosure may include the memory device 1200 having an improved integration density and improved characteristics, and thus it is possible to miniaturize the memory system 1000, and it is also possible to improve a performance the memory system 1000.

Figure 10:
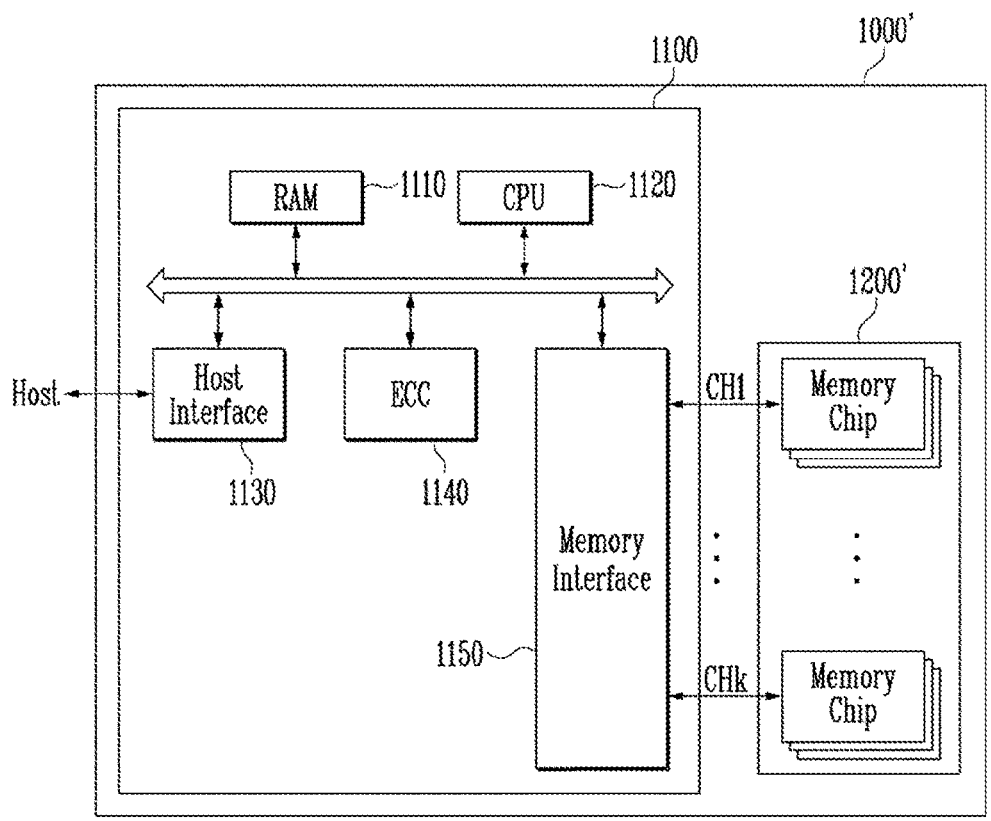
FIG. 10 is a diagram illustrating an example configuration of a memory system according to an embodiment of the present disclosure.

FIG. 10 is a diagram illustrating an example configuration of a memory system according to an embodiment of the present disclosure. Hereinafter, any repetitive detailed description will be omitted or simplified.

Referring to FIG. 10, the memory system 1000' according to an embodiment of the present disclosure may include a memory device 1200' and a controller 1100. The controller 1100 may include a RAM 1110, a CPU 1120, a host interface 1130, an ECC circuit 1140, a memory interface 1150, and the like.

The memory device 1200' may be a nonvolatile memory, and may be manufactured according to the manufacturing method described with reference to FIGS. 1A to 8B. The structure and manufacturing method of the memory device 1200' may be the same as those described above, and therefore their detailed descriptions will be omitted.

The memory device 1200' may be a multi-chip package including a plurality of memory chips. The plurality of memory chips are divided into a plurality of groups that can communicate with the controller 1100 over first to kth channels (CH1 to CHk). In addition, memory chips included in one group may communicate with the controller 1100 over a common channel. For reference, the memory system 1000' may be modified such that one memory chip is coupled to one channel.

As described above, the memory system 1000' according to an embodiment of the present disclosure may include the memory device 1200' having an improved integration density and improved characteristics, and thus it is possible to miniaturize the memory system 1000' and it is possible to improve a performance of the memory system 1000'. Particularly, the memory device 1200' may be formed in a multi-chip package, so that it is possible to increase the data storage capacity of the memory system 1000' and to improve the operation speed of the memory system 1000'.

Figure 11:
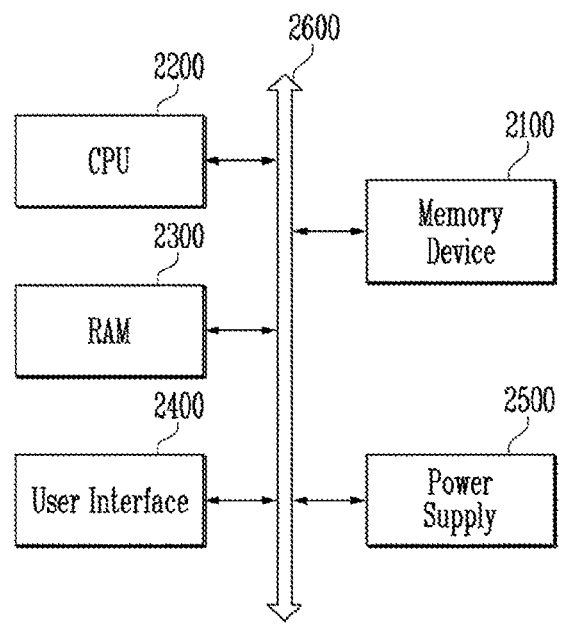
FIG. 11 is a diagram illustrating an example configuration of a computing system according to an embodiment of the present disclosure.

FIG. 11 is a diagram illustrating an example configuration of a computing system according to an embodiment of the present disclosure. Hereinafter, any repetitive detailed description will be omitted or simplified.

Referring to FIG. 11, the computing system 2000 according to an embodiment of the present disclosure may include a memory device 2100, a CPU 2200, a RAM 2300, a user interface 2400, a power source 2500, a system bus 2600, and the like.

The memory device 2100 may store data provided through the user interface 2400, data processed by the CPU 2200, and the like. In addition, the memory device 2100 may be electrically connected to the CPU 2200, the RAM 2300, the user interface 2400, the power source 2500, and the like through the system bus 2600. For example, the memory device 2100 may be connected to the system bus 2600 through a controller (not illustrated) or may be directly connected to the system bus 2600. When the memory device 2100 is directly connected to the system bus 2600, a function of the controller may be performed by the CPU 2200, the RAM 2300, etc.

Here, the memory device 2100 may be a nonvolatile memory, and may be manufactured according to the manufacturing method described with reference to FIGS. 1A to 8B. The structure and manufacturing method of the memory device 2100 may be the same as those described above, and therefore their detailed descriptions will be omitted.

The memory device 2100 may be a multi-chip package including a plurality of memory chips as described with reference to FIG. 10.

The computing system 2000 configured as described above may be a computer, a ultra mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for communicating information in a wireless environment, one of a variety of electronic devices constituting a home network, one of a variety of electronic devices constituting a computer network, one of a variety of electronic devices constituting a telematics network, an RFID device, etc.

As described above, the computing system 2000 according to an embodiment of the present disclosure may include the memory device 2100 having an improved integration density and improved characteristics, and thus it is possible to miniaturize the computing system 2000 and it is possible to improve a performance of the computing system 2000.

Figure 12:
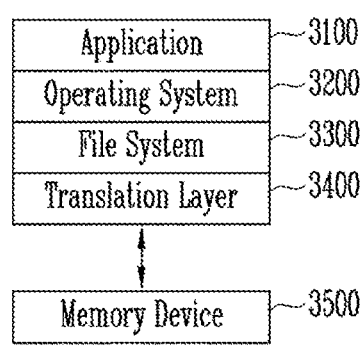
FIG. 12 is a diagram illustrating an example of a computing system according to an embodiment of the present disclosure.

FIG. 12 is a diagram illustrating an example of a computing system according to an embodiment of the present disclosure.

Referring to FIG. 12, the computing system 3000 according to an embodiment of the present disclosure may include a software layer including an operating system 3200, an application 3100, a file system 3300, a translation layer 3400, and the like. In addition, the computing system 3000 may include a hardware layer such as a memory device 3500.

The operating system 3200 may manage software resources and hardware resources of the computing system 3000, and may control program execution of a central processing unit. The application 3100 may be one of a variety of application programs running on the computing system 3000, and may be a utility executed by the operating system 3200.

The file system 3300 may be a logical structure for managing data files in the computing system 3000. The file system 3300 may organize the data files stored in the memory device 3500 according to a rule of the file system 3300. The file system 3300 may be determined depending on the operating system 3200 used in the computing system 3000. For example, when the operating system 3200 is one of Windows operating systems of Microsoft, the file system 3300 may be a file allocation table (FAT) or a NT file system (NTFS). When the operating system 3200 is one of Unix/ Linux operating systems, the file system 3300 may be an extended file system (EXT), a Unix file system (UFS), or a journaling file system (JFS).

In FIG. 12, the operating system 3200, the application 3100, and the file system 3300 are illustrated as individual blocks. However, the application 3100 and the file system 3300 may be included in the operating system 3200.

The translation layer 3400 may translate an address into a form suitable for the memory device 3500 in response to a request from the file system 3300. For example, the translation layer 3400 may translate a logical address generated by the file system 3300 into a physical address of the memory device 3500. Here, mapping information between the logical address and the physical address may be stored as an address translation table. For example, the translation layer 3400 may be a flash translation layer (FTL), a universal flash storage link layer (ULL), etc.

The memory device 3500 may be a nonvolatile memory, and may be manufactured according to the manufacturing method described with reference to FIGS. 1A to 8B. The structure and manufacturing method of the memory device 3500 are the same as those described above, and therefore their detailed descriptions will be omitted.

The computing system 3000 configured as described above may be divided into an operating system layer operating in an upper level region and a controller layer operating in a lower level region. Here, the application 3100, the operating system 3200, and the file system 3300 may be included in the operating system layer, and may be driven by the operation memory of the computing system 3000. In addition, the translation layer 3400 may be included in the operating system layer or the controller layer.

As described above, the computing system 3000 according to an embodiment of the present disclosure may include the memory device 3500 having an improved integration density and improved characteristics, and thus it is possible to miniaturize the memory system 1000, and it is also possible to improve a performance of the computing system 3000.

According to an embodiment of the present disclosure, holes and a slit, which penetrate a stack structure, are simultaneously formed, and patterns are uniformly distributed. Thus, the holes and the slit, which formed into a structure having a high aspect ratio, can have a uniform profile. Also, upper and lower portions of a channel pattern in the hole have a uniform width, and thus stacked memory cells have uniform characteristics. Also, widths of the holes and the slit can be decreased, thereby improving the integration density of a memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of manufacturing a semiconductor device, the method comprising:

forming a first stack structure by alternately stacking first material layers and second material layers;

forming first holes and a first slit, the first holes penetrating the first stack structure, the first slit being located between the first holes;

forming channel patterns in the first holes and a dummy channel pattern in the first slit;

selectively removing the dummy channel pattern from the first slit; and replacing the first material layers with third material layers through the first slit.

2. The method of claim 1, wherein forming the first holes and the first slit includes:

forming, on the first stack structure, a mask pattern including openings distributed at a uniform distance from one another; and forming the first holes and the first slit by etching the first stack structure using the mask pattern as an etch barrier.

3. The method of claim 2, wherein the first holes and the first slit are formed in a way that a thickness of the mask pattern is uniformly decreased.

4. The method of claim 1, wherein the first slit has a line shape extending in one direction and exposes all of the first material layers therethrough.

5. The method of claim 1, wherein selectively removing the dummy channel pattern includes:

forming a mask pattern on the first stack structure, the mask pattern covering the first holes and the channel patterns and exposing the first slit and the dummy channel pattern therethrough; and removing the dummy channel pattern from the first slit exposed through the mask pattern.

6. The method of claim 1, wherein the dummy channel pattern is formed together with the channel pattern when the channel pattern is formed.

7. The method of claim 1, further comprising forming memory patterns in the first holes and a dummy memory pattern in the first slit.

8. The method of claim 7, further comprising selectively removing the dummy memory pattern.

9. The method of claim 8, wherein the dummy channel pattern is etched using a wet etching process, and the dummy memory pattern is etched using a wet or dry etching process.

10. The method of claim 1, further comprising:

forming memory patterns in the first holes and a dummy memory pattern in the first slit;

forming an insulating layer on the first stack structure;

forming a first opening passing through the insulating layer, covering the channel patterns and the memory patterns, and exposing the dummy channel pattern;

forming a second opening by selectively removing the dummy channel pattern through the first opening; and selectively removing the dummy memory pattern through the first and second openings.

11. The method of claim 1, further comprising, after replacing the first material layers with the third material layers, forming a slit insulating layer in the first slit.

12. The method of claim 1, wherein the first material layers include a sacrificial material, the second material layers include an insulating material, and the third material layers include a conductive material.

13. The method of claim 1, further comprising:

forming a second stack structure on the first stack structure after forming the first holes and the first slit, the second stack structure including fourth material layers and fifth material layers which are alternately stacked; and forming second holes and a second slit, the second holes penetrating the second stack structure and being connected to the first holes, the second slit penetrating the second stack structure and being connected to the first slit.

14. The method of claim 13, wherein the channel patterns are formed in the first and second holes, and the dummy channel pattern is formed in the first and second slits.

15. The method of claim 14, further comprising, after the dummy channel pattern is selectively removed, performing an etch-back process such that the first slit and the second slit have a uniform width.

16. A method of manufacturing a semiconductor device, the method comprising:

forming a first stack structure by alternately stacking first sacrificial layers and the first insulating layers;

forming first holes and a first slit, the first holes penetrating the first stack structure, the first slit being located between the first holes;

forming, on the first stack structure, a second stack structure by alternately stacking second sacrificial layers and second insulating layers;

forming second holes and a second slit, the second holes penetrating the second stack structure and being connected to the first holes, the second slit penetrating the second stack structure and being connected to the first slit;

forming channel patterns in the first and second holes and a dummy channel pattern in the first and second slits;

selectively removing the dummy channel pattern; and replacing the first and second sacrificial layers with conductive layers through the first and second slits.

17. The method of claim 16, wherein forming the first holes and the first slit includes:

forming a mask pattern on the first stack structure, the mask pattern includes openings distributed at a uniform distance from one another; and forming the first holes and the first slit by etching the first stack structure using the mask pattern as an etch barrier.

18. The method of claim 17, wherein the first holes and the first slit are formed in a way that a thickness of the mask pattern is uniformly decreased.

19. The method of claim 16, wherein forming the second holes and the second slit includes:

forming a mask pattern on the second stack structure, the mask pattern including openings distributed at a uniform distance from one another; and forming the second holes and the second slit by etching the second stack structure using the mask pattern as an etch barrier.

20. A method of manufacturing a semiconductor device, the method comprising:

forming a structure by alternately stacking first material layers and second material layers;

forming holes and a slit using a same mask pattern, the holes penetrating the stack structure, the slit being located between the holes;

forming channel patterns in the holes and a dummy channel pattern in the slit, wherein the dummy channel pattern is formed when the channel patterns are formed;

selectively removing the dummy channel pattern from the slit; and replacing the first material layers with third material layers through the slit.

\* \* \* \* \*